(12) United States Patent
Jeong et al.

(10) Patent No.: US 8,947,947 B2
(45) Date of Patent: Feb. 3, 2015

(54) INTEGRATED CIRCUIT AND MEMORY DEVICE

(75) Inventors: Jeongsu Jeong, San Jose, CA (US); Jeongtae Hwang, Gyeonggi-do (KR); Igsoo Kwon, San Jose, CA (US); Yeonuk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 252 days.

(21) Appl. No.: 13/591,731

(22) Filed: Aug. 22, 2012

(65) Prior Publication Data

US 2014/0056084 A1 Feb. 27, 2014

(51) Int. Cl.
*G11C 5/14* (2006.01)

(52) U.S. Cl.
USPC .............. 365/189.09; 365/185.18; 365/225.7; 365/226

(58) Field of Classification Search
USPC ..................... 365/189.09, 185.18, 225.7, 226
See application file for complete search history.

(56) References Cited

U.S. PATENT DOCUMENTS

| 7,269,047 | B1 | 9/2007 | Fong et al. | |
|---|---|---|---|---|
| 2006/0279442 | A1* | 12/2006 | Kimura et al. | 341/121 |
| 2009/0021985 | A1* | 1/2009 | Byeon | 365/185.18 |

\* cited by examiner

*Primary Examiner* — Richard Elms
*Assistant Examiner* — Mohammed A Bashar
(74) *Attorney, Agent, or Firm* — IP & T Group LLP

(57) ABSTRACT

An integrated circuit includes a plurality of internal circuits, an e-fuse array circuit configured to store a data used by the internal circuits, and a fuse circuit configured to store a trimming data to set the e-fuse array circuit.

10 Claims, 8 Drawing Sheets

INTEGRATED CIRCUIT AND MEMORY DEVICE

BACKGROUND

1. Field

Exemplary embodiments of the present invention relate to an integrated circuit, and more particularly, to a fuse circuit disposed in the integrated circuit.

2. Description of the Related Art

Diverse integrated circuit chips use fuses to store data used for the operation thereof, such as a setup data and a repair data. A general fuse recognizes a data based on whether the fuse is cut by a laser or not. Therefore, a fuse may be programmed in the stage of wafer, but after the wafer is mounted on a package, the fuse may not be programmed. Therefore, an e-fuse is used. The e-fuse stores a data by using a transistor and changing the resistance between a gate and a drain/source of the transistor.

FIG. 1 illustrates an e-fuse including a transistor, where the e-fuse operates as a resistor or a capacitor.

Referring to FIG. 1, the e-fuse includes a transistor T, and a power supply voltage is applied to a gate G while a ground voltage is applied to a drain/source D/S.

When a power supply voltage of such a level that the transistor T may endure is applied to the gate G, the e-fuse operates as a capacitor C. Therefore, no current flows between the gate G and the drain D or the source S. However, when a voltage of such a level that the transistor T may not endure is applied to the gate G, the gate oxide of the transistor T is destroyed to short the gate G and the drain source D/S from each other. As a result, the e-fuse operates as a resistor R. Therefore, current flows between the gate G and the drain/source D/S.

Based on the above described features, the data of the e-fuse is recognized based on the resistance value between the gate G and the drain/source D/S of the e-fuse. The data of the e-fuse may be stably recognized by (1) forming the transistor T in a big size, or (2) using an amplifier, instead of increasing the size of the transistor T, and amplifying the current flowing through the transistor T. When the transistor T is formed in a big size, the data of the e-fuse may be recognized without performing an amplification operation. The above two methods, however, have limitation of dimensions because the transistor T that constitutes the e-fuse is to be designed big or each e-fuse is to be equipped with an amplifier for amplifying a data.

U.S. Pat. No. 7,269,047 discloses a technology of forming an e-fuse in a type of an e-fuse array in order to reduce the area occupied by the e-fuse. FIG. 2 is a block view illustrating a conventional e-fuse array circuit.

Referring to FIG. 2, the e-fuse array circuit includes a cell array having a plurality of memory cells 201, 202, 203 and 204, a row control circuit 210, a voltage providing circuit 220, and a column control circuit 230.

The memory cells 201, 202, 203 and 204 include memories M1, M2, M3 and M4 and switches S1, S2, S3 and S4, respectively. The memories M1, M2, M3 and M4 are e-fuses having the characteristics of resistors or capacitors depending on whether they are ruptured or not. In other words, the e-fuses M1, M2, M3 and M4 may be regarded as resistive memories for storing data based on the intensity of resistance. The switches S1, S2, S3 and S4 electrically connect the memories M1, M2, M3 and M4 with column lines BL0 and BL1 under the control of row lines WLR0 and WLR1.

The row control circuit 210 includes a row decoder 211 and a plurality of voltage transformers 212 and 213. The row decoder 211 activates a signal of a line selected between the row lines WLR0 and WLR1 to a logic high level and turns on a corresponding switch by decoding an address ADD. The voltage transformers 212 and 213 drive the voltage of program/read lines WLP0 and WLP1 to a logic low level when the signals of the row lines WLR0 and WLR1 inputted thereto are deactivated. When the signals of the row lines WLR0 and WLR1 inputted thereto are activated, the voltage transformers 212 and 213 provide the program/read lines WLP0 and WLP1 with a voltage P/R BIAS which is received from the voltage providing circuit 220.

The voltage providing circuit 220 supplies such a high voltage as to destroy the gate oxides of the e-fuses M1, M2, M3 and M4 (which is a voltage generated by pumping a power supply voltage) to the voltage transformers 212 and 213 when a program operation is performed (when the corresponding fuses are to be ruptured). When a read operation is performed, the voltage providing circuit 220 supplies a voltage of an appropriate level for performing the read operation, which is generally a power supply voltage, to the voltage transformers 212 and 213.

The column control circuit 230 includes a column decoder 231, a current limiter 232, and a sense amplifier 233. The column decoder 231 electrically connects a line selected between the column lines BL0 and BL1 with the current limiter 232 by decoding the address ADD. The current limiter 232 includes a transistor that is controlled based on a bias voltage and it sinks the current of the selected line between the column lines BL0 and BL1 to a ground voltage terminal. The sense amplifier 233 compares the voltage of a node between the current limiter 232 and the column lines BL0 and BL1 with a reference voltage VREF and senses a data. When a memory cell selected by the row decoder 211 and the column decoder 231 is ruptured, current flows through the current limiter 232. Therefore, the sense amplifier 233 generates an output data FUSE_DATA of a logic high level. When the selected memory cell is not ruptured, no current flows through the current limiter 232. Therefore, the sense amplifier 233 generates an output data FUSE_DATA of a logic low level.

Although FIG. 2 illustrates an e-fuse array circuit including four e-fuses, the e-fuse array circuit may include a plurality of e-fuses to have a capacity of several kilobits (kb) to tens of megabits (Mb).

FIG. 3 is a block view exemplarily illustrating an e-fuse array circuit in an integrated circuit chip. Referring to FIG. 3, the integrated circuit chip includes a plurality of internal circuits 311 to 313 and an e-fuse array circuit 320.

The e-fuse array circuit 320 stores various data to be used by the first to third internal circuits 311 to 313. The data stored in the e-fuse array circuit 320 are transferred to the first to third internal circuits 311 to 313 during the initial operation of the integrated circuit chip.

The first to third internal circuits 311 to 313 use a data FUSE_DATA transferred from the e-fuse array circuit 320. For example, the first internal circuit 311 may be a circuit for generating a plurality of internal voltages having a level decided based on the data FUSE_DATA transferred from the e-fuse array circuit 320. The second internal circuit 312 may be a circuit for performing diverse setup operations of the integrated circuit chip based on the data FUSE_DATA transferred from the e-fuse array circuit 320. The third internal circuit 313 may be a circuit for performing a repair operation for substituting a defective portion with a portion having no defect in the integrated circuit chip based on the data FUSE_DATA transferred from the e-fuse array circuit 320.

The first to third internal circuits 311 to 313 receives an optimum setup data for an operation and a trimming data from the e-fuse array circuit, and they may operate with optimum setup values. However, since the e-fuse array circuit 320 may not operate after obtaining the optimum setup value for itself, it may be difficult to make sure of stable operation of the e-fuse array circuit 320.

SUMMARY

An embodiment of the present invention is directed to a technology for stable operation of an e-fuse array circuit storing diverse data used for operation of an internal circuit.

In accordance with an embodiment of the present invention, an integrated circuit includes: a plurality of internal circuits; an e-fuse array circuit configured to store a data used by the internal circuits; and a fuse circuit configured to store a trimming data to set the e-fuse array circuit.

The capacity of the trimming data stored in the fuse circuit may be less than 1/100 of a capacity of a data stored in the e-fuse array circuit. The fuse circuit of the integrated circuit may include: a plurality of e-fuses; and a sense amplifier disposed in each of the e-fuses. The fuse circuit may include a plurality of laser fuses.

In accordance with another embodiment of the present invention, a memory device includes a plurality of memory banks; a plurality of repair circuits configured to perform a repair operation of the memory banks; a plurality of test mode circuits configured to perform a setup operation of the memory device; an e-fuse array circuit configured to store a repair data to be used by the repair circuits and a setup data to be used by the test mode circuits; and a fuse circuit configured to store a trimming data to set the e-fuse array circuit.

In accordance with further embodiment of the present invention, an e-fuse array circuit includes a plurality of memory cells each including an e-fuse and a switch; a voltage providing circuit configured to supply a voltage having a level determined in response to a trimming data; a row control circuit configured to transfer the voltage supplied from the voltage providing circuit to a memory cell selected from the memory cells; and a column control circuit configured to sense a data of the selected memory cell using a reference voltage generated in response to a trimming data.

DETAILED DESCRIPTION

Figure 1:
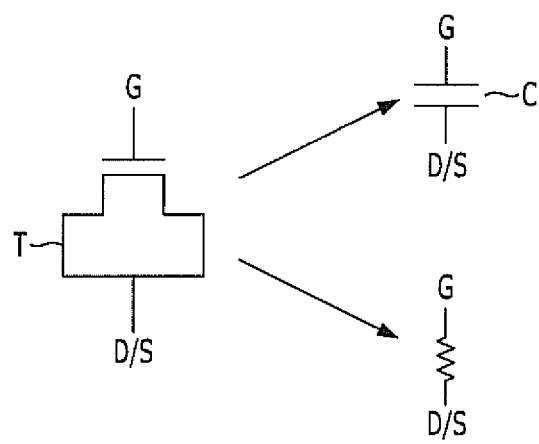
FIG. 1 illustrates an e-fuse including a transistor, where the e-fuse operates as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
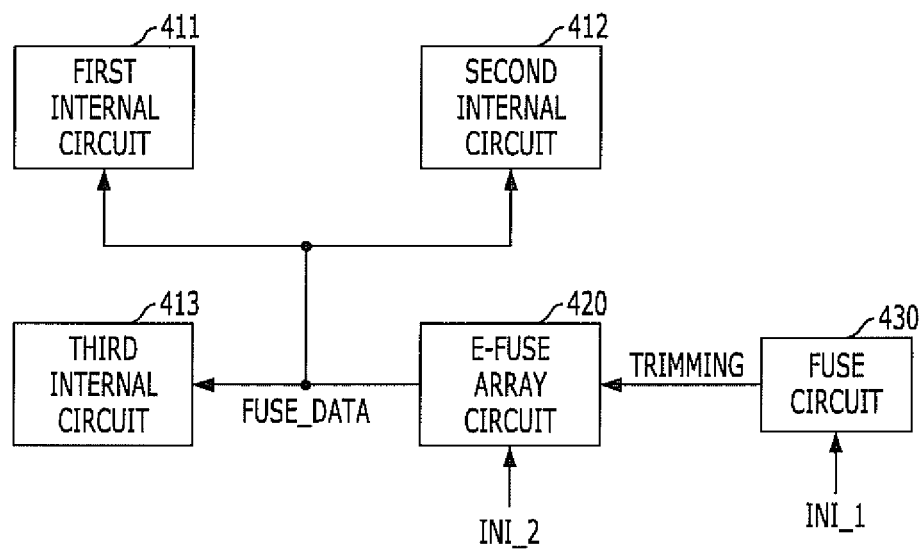
FIG. 4 is a block diagram illustrating an integrated circuit chip in accordance with an embodiment of the present invention.

FIG. 4 is a block diagram illustrating an integrated circuit chip in accordance with an embodiment of the present invention.

Referring to FIG. 4, the integrated circuit chip includes a plurality of internal circuits 411 to 413, an e-fuse array circuit 420, and a fuse circuit 430.

The e-fuse array circuit 420 stores various data to be used by the first to third internal circuits 411 to 413. The data FUSE_DATA stored in the e-fuse array circuit 420 are transferred to the first to third internal circuits 411 to 413 during the initial operation of the integrated circuit chip. The e-fuse array circuit 420 is set with the optimum value that is appropriate for an operation based on a trimming data TRIMMING transferred from the fuse circuit 430, which is different from the conventional e-fuse array circuit 320 shown in FIGS. 2 and 3. A second initialization signal INI_2 inputted to the e-fuse array circuit 420 is a signal for enabling the e-fuse array circuit 420. The e-fuse array circuit 420 transfers the data FUSE_DATA to the first to third internal circuits 411 to 413 after the second initialization signal INI_2 is enabled.

The first to third internal circuits 411 to 413 use data transferred from the e-fuse array circuit 420. For example, the first internal circuit 411 may be a circuit for generating a plurality of internal voltages having a level decided based on the data FUSE_DATA transferred from the e-fuse array circuit 420. The second internal circuit 412 may be a circuit for performing diverse setup operations of the integrated circuit chip based on the data FUSE_DATA transferred from the e-fuse array circuit 420. The third internal circuit 413 may be a circuit for performing a repair operation for substituting a defective portion with a portion having no defect in the integrated circuit chip based on the data FUSE_DATA transferred from the e-fuse array circuit 420.

The fuse circuit 430 stores a trimming data TRIMMING of the e-fuse array circuit 420 and transfers the trimming data TRIMMING to the e-fuse array circuit 420 before the e-fuse array circuit 420 performs an operation. In other words, during the initial operation of the integrated circuit chip, the fuse circuit 430 transfers the trimming data TRIMMING to the e-fuse array circuit 420, and the e-fuse array circuit 420 operates based on the trimming data TRIMMING to transfer the data FUSE_DATA to the first to third internal circuits 411 to 413. Here, the trimming data TRIMMING includes a tuning data about a read voltage used in the e-fuse array circuit 420, a tuning data about the level of the reference voltage, and a tuning data about the operation timing of each circuit in the e-fuse array circuit 420. Since the fuse circuit 430 stores a simple trimming data TRIMMING that is used for the operation of the e-fuse array circuit 420, the fuse circuit 430 may be designed to have a capacity of several bits to tens of bits. This is a quite great difference considering that the e-fuse array circuit 420 generally has a capacity of tens of kilobits to tens of megabits. The fuse circuit 430 may be formed to instantly transfer the data stored in the fuse circuit 430 to the e-fuse array circuit 420 without an intermediate process such as the selection of a row and a column by decoding an address. A first initialization signal INI_1 that is inputted to the fuse circuit 430 is an enable signal for the fuse circuit 430. The fuse circuit 430 transfers the trimming data TRIMMING stored therein to the e-fuse array circuit 420 after the first initialization signal INI_1 is enabled.

Figure 5:
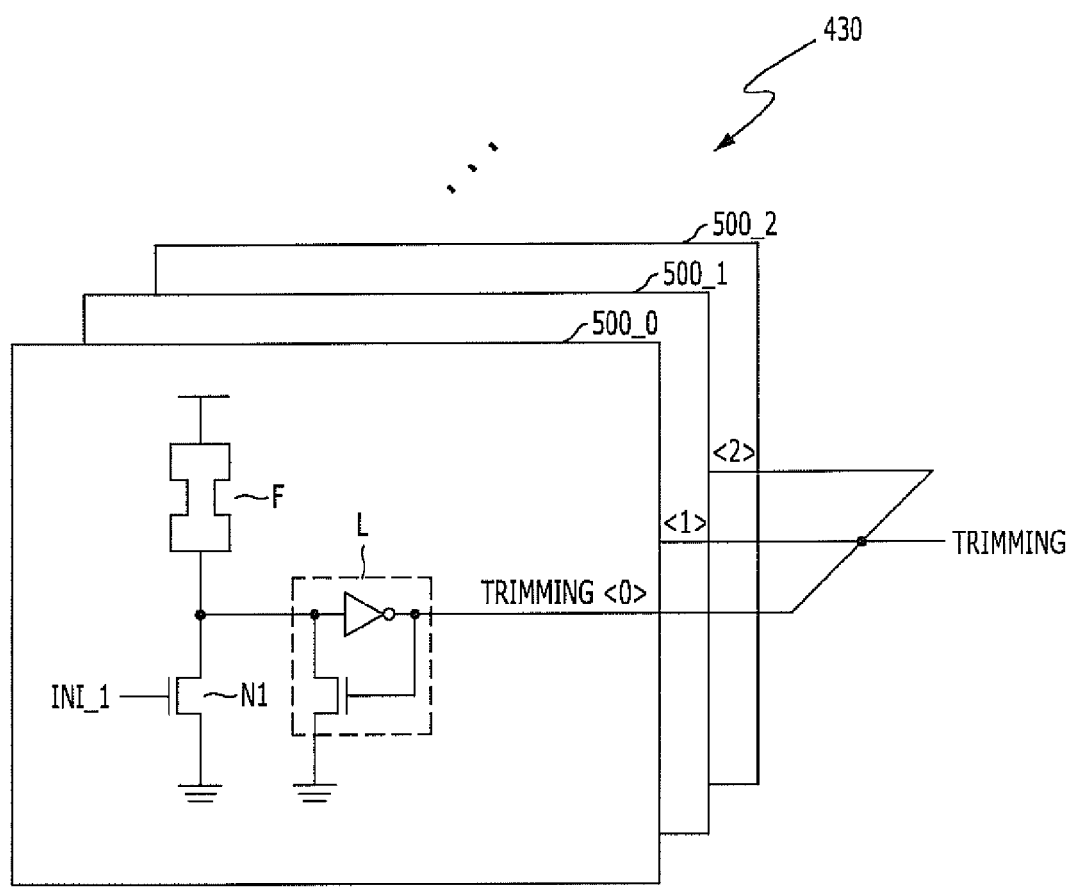
FIG. 5 is a block diagram illustrating a fuse circuit 430 shown in FIG. 4 in accordance with an embodiment of the present invention.

FIG. 5 is a block diagram illustrating the fuse circuit 430 shown in FIG. 4 in accordance with the embodiment of the present invention. Referring to FIG. 5, the fuse circuit 430 includes as many fuse units 500_0, 500_1, 500_2 . . . as the number of bits corresponding to the storage capacity of the fuse circuit 430. For example, when the fuse circuit 430 store a 10-bit data, the fuse circuit 430 includes 10 fuse units 500_0, . . . , 500_9.

The fuse unit 500_0 includes a laser fuse F, a transistor N, and a latch L. To have a look at the operation, when a pulse signal, which is the first initialization signal INI_1, is enabled, the transistor N is turned on to initialize the voltage of an output node TRIMMING<0> to a logic high level. Subsequently, when the first initialization signal INI_1 is disabled, the transistor N is turned off. At this time, when the laser fuse F is cut, the voltage of an output node TRIMMING<0> is maintained in a logic high level. When the laser fuse F is not cut, the voltage of the output node TRIMMING<0> transitions to a logic low level.

In short, the fuse unit 500_0 begins to operate after the first initialization signal INI_1 is enabled, and when the laser fuse F is cut, the fuse unit 500_0 outputs a data TRIMMING<0> of a logic high level. When the laser fuse F is not cut, the fuse unit 500_0 outputs a data TRIMMING<0> of a logic low level.

Figure 6:
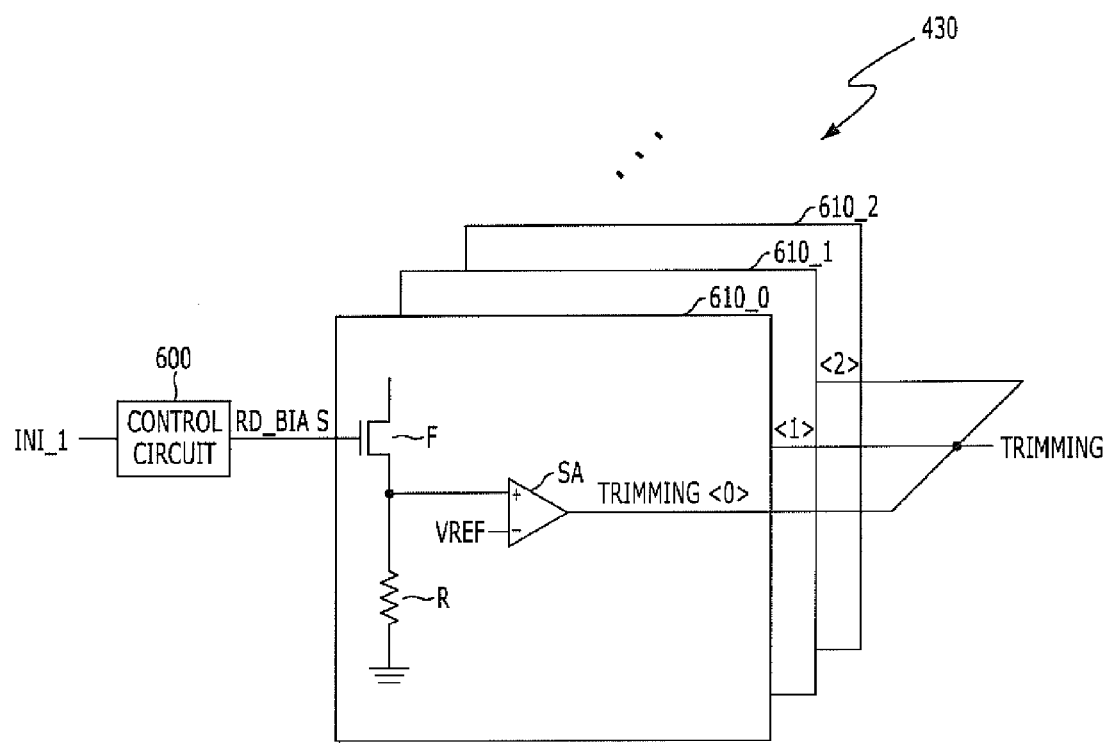
FIG. 6 is a block diagram illustrating a fuse circuit 430 shown in FIG. 4 in accordance with another embodiment of the present invention.

FIG. 6 is a block diagram illustrating the fuse circuit 430 shown in FIG. 4 in accordance with another embodiment of the present invention. FIG. 6 illustrates an example of the fuse circuit 430 that includes e-fuses. Referring to FIG. 6, the fuse circuit 430 includes a control circuit 600 and a plurality of fuse units 610_0, 610_1, 610_2 . . . . The fuse units 610_0, 610_1, 610_2 . . . are provided as many as the number of bits corresponding to the storage capacity of the fuse circuit 430. For example, when the fuse circuit 430 stores a 10-bit data, the fuse circuit 430 includes 10 fuse units 610_0, . . . , 610_9.

The control circuit 600 provides a read voltage RD_BIAS from a moment when the first initialization signal INI_1 is enabled so that a data may be read from the fuse units 610_0, 610_1, 610_2 . . . .

The fuse unit 610_0 includes an e-fuse F, a resistor R, and a sense amplifier SA. When the e-fuse F is ruptured, the e-fuse F operates as a resistor. Therefore, the sense amplifier SA outputs a data TRIMMING<0> of a logic high level. When the e-fuse F is not ruptured, the e-fuse F operates as a capacitor. Therefore, the sense amplifier SA outputs a data TRIMMING<0> of a logic low level.

In short, the fuse unit 610_0 begins to operate after the first initialization signal INI_1 is enabled, and when the e-fuse F is ruptured, the fuse unit 610_0 outputs a data of a logic high level. When the e-fuse F is not ruptured, the fuse unit 610_0 outputs a data of a logic low level.

Figure 2:
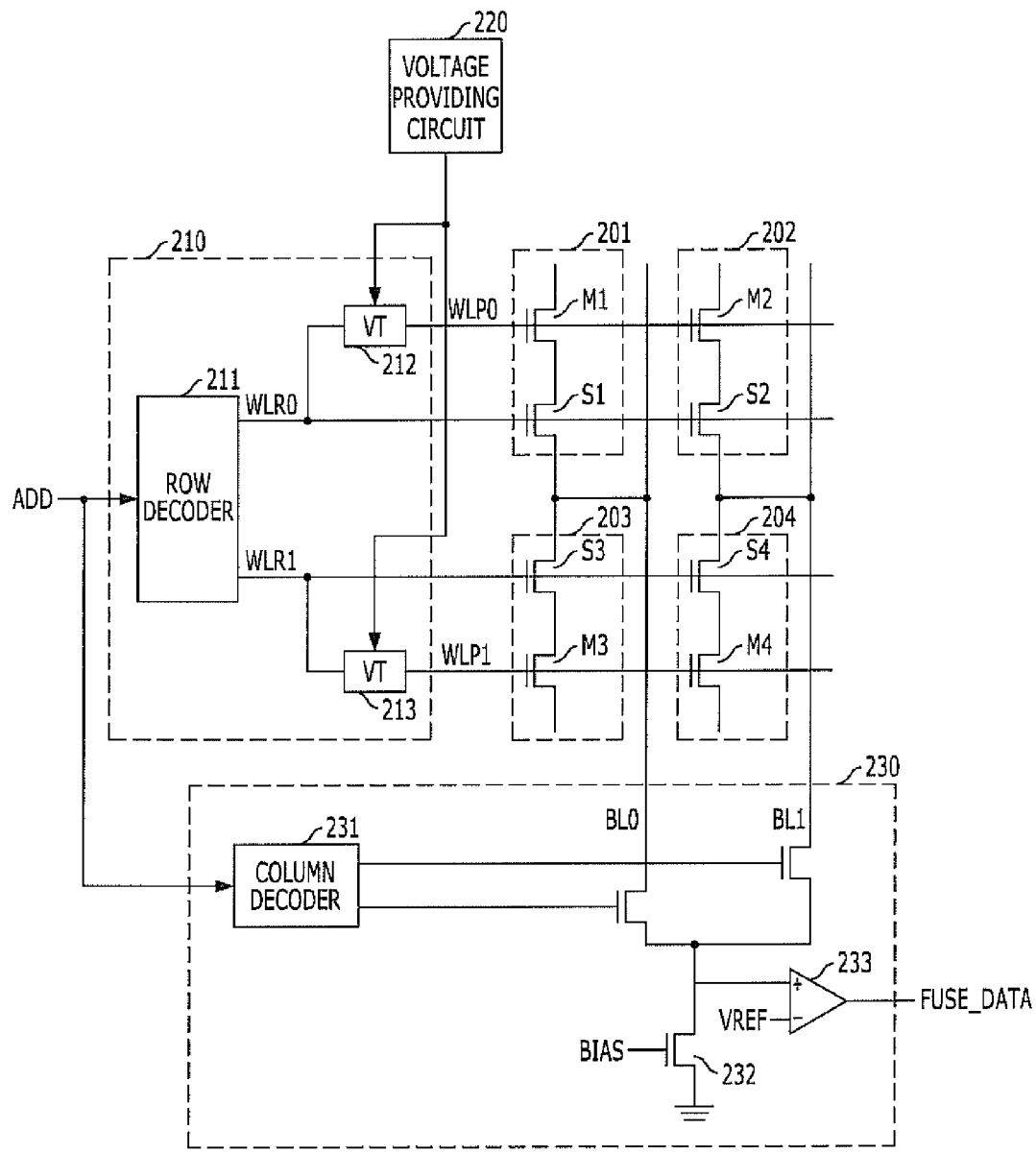
FIG. 2 is a block diagram illustrating a conventional e-fuse array.
Figure 3:
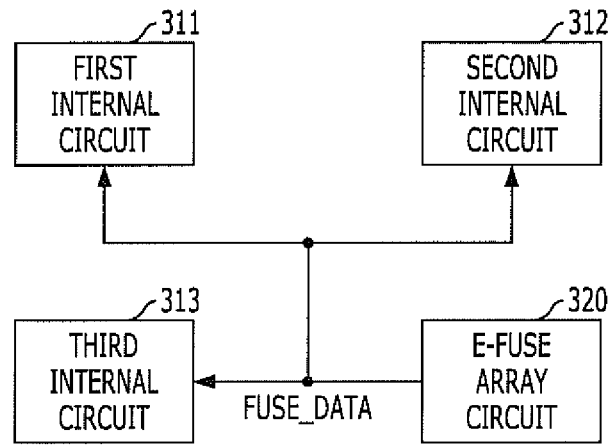
FIG. 3 is a block diagram exemplarily illustrating an e-fuse array circuit in an integrated circuit chip.
Figure 7:
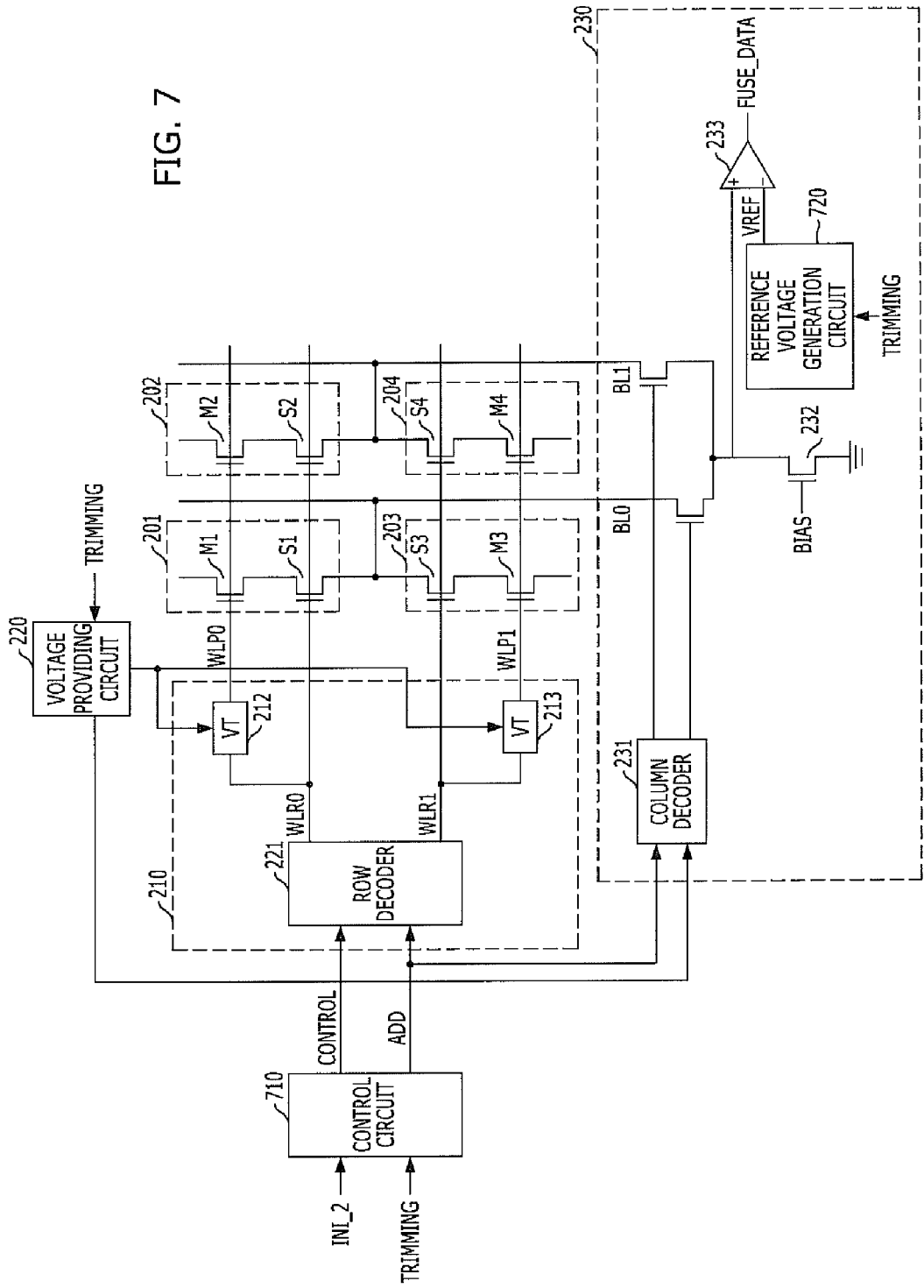
FIG. 7 is a block diagram illustrating an e-fuse array circuit 420 shown in FIG. 4.

FIG. 7 is a block diagram illustrating the e-fuse array circuit 420 shown in FIG. 4. Hereinafter, the structure that is different from the structure of FIG. 2 is described.

A control circuit 710 controls the e-fuse array circuit 420 to begin operating in response to the second initialization signal INI_2. Also, the control circuit 710 sets the operation timings of the internal structure of the e-fuse array circuit 420 to the optimum values based on the trimming data TRIMMING transferred from the fuse circuit 430. Also, the control circuit 710 sequentially changes the address ADD so that all the data stored in a cell array 201 to 204 are sequentially outputted and transferred to the first to third internal circuits 411 to 413.

A voltage providing circuit 220 controls the level of the read voltage applied to voltage transformers 212 and 213 based on the trimming data TRIMMING transferred from the fuse circuit 430. Also, a reference voltage generation circuit 720 controls the level of the reference voltage VREF that the reference voltage generation circuit 720 generates based on the trimming data TRIMMING transferred from the fuse circuit 430.

As described above, since the operation timing of the e-fuse array circuit 420, the level of the read voltage, and the level of the reference voltage VREF are set to the optimum values based on the trimming data TRIMMING transferred from the fuse circuit 430, the e-fuse array circuit 420 may perform a stable operation.

Figure 8:
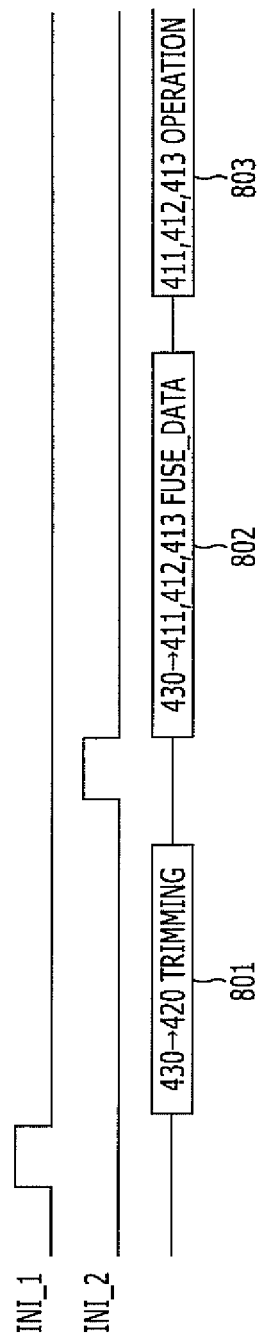
FIG. 8 is a timing diagram illustrating an operation sequence of the integrated circuit chip shown in FIG. 4.

FIG. 8 is a timing diagram illustrating an operation sequence of the integrated circuit chip shown in FIG. 4.

Referring to FIG. 8, in the first place, when the first initialization signal INI_1 is enabled, the trimming data TRIMMING is transferred from the fuse circuit 430 to the e-fuse array circuit 420 in response to the enabling of the first initialization signal INI_1 (duration '801'). The e-fuse array circuit 420 sets its parameters to optimum values based on the received trimming data TRIMMING. Subsequently, when the second initialization signal INI_2 is enabled, a data FUSE_DATA used for the operation of the first to third internal circuits 411 to 413 is transferred from the e-fuse array circuit 420 to the first to third internal circuits 411 to 413 (duration '802'). The first to third internal circuits 411 to 413 then begin operating based on the received data.

Figure 9:
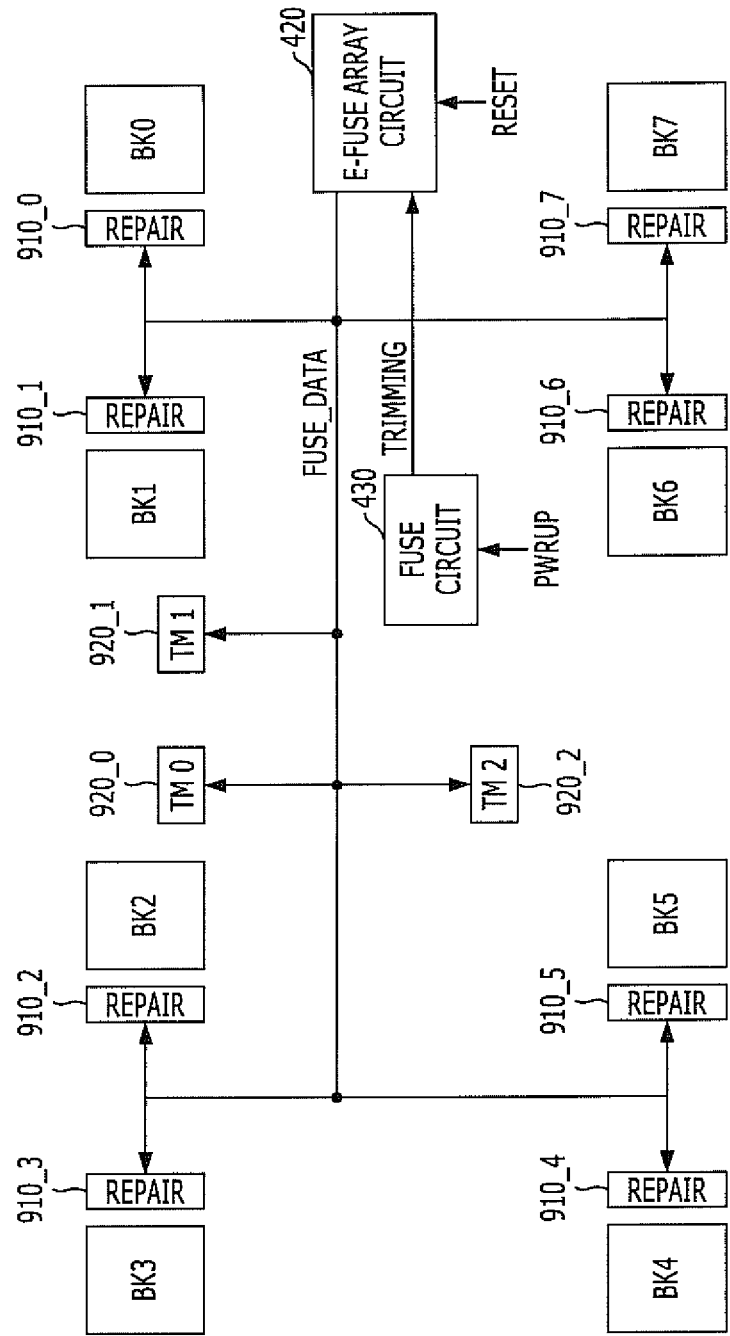
FIG. 9 is a block diagram illustrating a memory device in accordance with an embodiment of the present invention.

FIG. 9 is a block diagram illustrating a memory device in accordance with an embodiment of the present invention. Although FIG. 4 illustrates an example where the technology of the present invention is applied to a general integrated circuit chip, FIG. 9 illustrates an example where the technology of the present invention is applied to a memory device.

Referring to FIG. 9, the memory device includes a plurality of memory banks BK0 to BK7, a plurality of repair circuits 910_0 to 910_7, a plurality of test mode circuits 920_0 to 920_2, an e-fuse array circuit 420, and a fuse circuit 430.

Each of the memory banks BK0 to BK7 includes a plurality of memory cells. The memory cells may be Dynamic Random Access Memory (DRAM) cells. The memory banks BK0 to BK7 may be provided with the repair circuits 910_0 to 910_7, respectively, and the repair circuits 910_0 to 910_7 performs a repair operation for the memory banks BK0 to BK7 that respectively correspond thereto. Here, the repair operation means an operation for substituting defective cells in the memory banks BK0 to BK7 with redundancy cells. For the repair operation of the repair circuits 910_0 to 910_7, it should be figured out which memory cells are defective memory cells in the memory banks BK0 to BK7. The data about the defective memory cells is received from the e-fuse array circuit 420.

The test mode circuits 920_0 to 920_2 are a circuit for setting up diverse values used for the operation of the memory device. For example, the test mode circuit 920_0 may be a circuit for setting up a parameter, such as latency of the memory device, and the test mode circuits 920_1 and 920_2 may be circuits for setting up the levels of diverse internal voltages that are used in the memory device.

The fuse circuit 430 transfers the trimming data TRIMMING to the e-fuse array circuit 420 in response to a power-up signal PWRUP, and the e-fuse array circuit 420 transfers a fuse data FUSE_DATA to the repair circuits 910_0 to 910_7 and the test mode circuits 920_0 to 920_2 in response to a reset signal RESET. Here, the power-up signal PWRUP is enabled when a power supply voltage is stabilized during the initialization operation of the memory device, and the reset signal RESET is a signal for initializing diverse circuits in the memory device. The power-up signal PWRUP is enabled first during the initial operation of the memory device, and then the reset signal RESET is enabled. In short, the power-up signal PWRUP corresponds to the first initialization signal INI_1 shown in FIG. 4, and the reset signal RESET corresponds to the second initialization signal INI_2.

According to an embodiment of the present invention, a fuse circuit having a simple structure for storing a data for trimming an e-fuse array circuit is provided. Therefore, diverse voltage values and set values of the e-fuse array circuit may be trimmed, thereby securing stable operation of the e-fuse array circuit.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
 a plurality of internal circuits;
 an e-fuse array circuit configured to store a data used by the internal circuits; and
 a fuse circuit configured to store a trimming data to set the e-fuse array circuit,
 wherein a capacity of the trimming data stored in the fuse circuit is less than 1/100 of a capacity of a data stored in the e-fuse array circuit.

2. The integrated circuit of claim 1, wherein the fuse circuit includes:
 a plurality of e-fuses; and
 a sense amplifier disposed in each of the e-fuses.

3. The integrated circuit of claim 1, wherein the fuse circuit includes a plurality of laser fuses.

4. The integrated circuit of claim 1, wherein the e-fuse array circuit is configured to read the data to be transferred to the internal circuits using a read bias voltage and a sensing reference voltage determined by the trimming data.

5. The integrated circuit of claim 1, wherein during an initial operation of the integrated circuit,
 the fuse circuit is configured to transfer the trimming data to the e-fuse array circuit, and
 the e-fuse array circuit is configured to transfer the data stored therein to the internal circuits based on the received trimming data.

6. A memory device, comprising:
 a plurality of memory banks;
 a plurality of repair circuits configured to perform a repair operation of the memory banks;
 a plurality of test mode circuits configured to perform a setup operation of the memory device;
 an e-fuse array circuit configured to store a repair data to be used by the repair circuits and a setup data to be used by the test mode circuits; and
 a fuse circuit configured to store a trimming data to set the e-fuse array circuit.

7. The memory device of claim 6, wherein the fuse circuit is configured to transfer the trimming data to the e-fuse array circuit in response to a power-up signal, and
 the e-fuse array circuit is configured to transfer the repair data and the setup data to the repair circuits and the test mode circuits in response to a reset signal.

8. The integrated circuit of claim 6, wherein the e-fuse array circuit is configured to read the repair data and the setup data to be transferred to the repair circuits and the test mode circuits using a read bias voltage and a sensing reference voltage determined by the trimming data.

9. An integrated circuit, comprising:
 a plurality of internal circuits;
 an e-fuse array circuit configured to store a data used by the internal circuit; and
 a fuse circuit configured to store a trimming data to set the e-fuse array circuit,
 wherein the e-fuse array circuit comprises:
  a plurality of memory cells each including an c-fuse and a switch;
  a voltage providing circuit configured to supply a voltage having a level determined in response to the trimming data;
  a row control circuit configured to transfer the voltage supplied from the voltage providing circuit to a memory cell selected from the memory cells; and
  a column control circuit configured to sense a data of the selected memory cell using a reference voltage generated in response to the trimming data, and
 wherein a capacity of the trimming data stored in the fuse circuit is less than 1/100 of a capacity of a data stored in the c-fuse array circuit.

10. The integrated circuit of claim 9, further comprising:
 a control circuit configured to set operation timings of the row and column control circuits in response to the trimming data.

* * * * *